(12) United States Patent
Ishimaru

(10) Patent No.: US 8,093,072 B2
(45) Date of Patent: Jan. 10, 2012

(54) SUBSTRATE PROCESSING APPARATUS AND METHOD OF MANUFACTURING SEMICONDUCTOR DEVICE

(75) Inventor: Nobuo Ishimaru, Takaoka (JP)

(73) Assignee: Hitachi Kokusai Electric, Inc, Tokyo (JP)

( * ) Notice: Subject to any disclaimer, the term of this patent is extended or adjusted under 35 U.S.C. 154(b) by 0 days.

(21) Appl. No.: 12/618,248

(22) Filed: Nov. 13, 2009

(65) Prior Publication Data

US 2010/0130009 A1 May 27, 2010

(30) Foreign Application Priority Data

Nov. 26, 2008 (JP) .................................. 2008-300961

(51) Int. Cl.
*H01L 21/66* (2006.01)
*H01L 21/67* (2006.01)

(52) U.S. Cl. .............. 438/14; 118/723 ER; 156/345.24; 156/345.47; 257/E21.529

(58) Field of Classification Search ................... 438/14; 118/723 ER; 156/345.33, 345.44, 345.47, 156/345.48, 345.24; 257/E21.529
See application file for complete search history.

(56) References Cited

U.S. PATENT DOCUMENTS

| 7,500,445 B2 * | 3/2009 | Zhao et al. | 118/723 E |
| 7,824,520 B2 * | 11/2010 | Nakamura | 156/345.43 |
| 2003/0164143 A1 * | 9/2003 | Toyoda et al. | 118/723 E |
| 2004/0144490 A1 * | 7/2004 | Zhao et al. | 156/345.47 |

FOREIGN PATENT DOCUMENTS

JP 2006-190770 7/2006

* cited by examiner

*Primary Examiner* — Mary Wilczewski
*Assistant Examiner* — Toniae Thomas
(74) *Attorney, Agent, or Firm* — Brundidge & Stanger, P.C.

(57) ABSTRACT

Provided are a substrate processing apparatus and a method of manufacturing a semiconductor device, in which shape variations of discharge electrodes can be early detected so as to prevent a film having a non-uniform thickness from being formed on a substrate. The substrate processing apparatus includes a process chamber configured to stack a plurality of substrates therein, a gas supply unit configured to supply gas to an inside of the process chamber, at least one pair of electrodes installed in the process chamber and configured to receive high-frequency power to generate plasma that excites the gas supplied to the inside of the process chamber, and a monitoring system configured to monitor a shape variation of the electrodes.

7 Claims, 10 Drawing Sheets

ABSORPTION FREQUENCY:
44. 3MHz

ABSORPTION FREQUENCY:
45.9MHz

SUBSTRATE PROCESSING APPARATUS AND METHOD OF MANUFACTURING SEMICONDUCTOR DEVICE

CROSS-REFERENCE TO RELATED PATENT APPLICATION

This U.S. non-provisional patent application claims priority under 35 U.S.C. §119 of Japanese Patent Application No. 2008-300961, filed on Nov. 26, 2008, in the Japanese Patent Office, the entire contents of which are hereby incorporated by reference.

BACKGROUND OF THE INVENTION

1. Field of the Invention

The present invention relates to a substrate processing apparatus configured to perform an etching process or a film forming process on the surface of a substrate such as a semiconductor wafer, and a method of manufacturing a semiconductor device.

2. Description of the Prior Art

As an example of substrate processing apparatuses, a semiconductor manufacturing apparatus is known, and as an example of semiconductor manufacturing apparatuses, a vertical diffusion chemical vapor deposition (CVD) apparatus is known. Such a vertical diffusion CVD apparatus includes a narrow and long vertical buffer chamber at a position close to the inner wall of a reaction tube configured to process a substrate, and in the buffer chamber, discharge electrodes and a gas nozzle are provided in astute where the discharge electrodes are surrounded by two dielectric tubes. High-frequency power generated by an oscillator is applied across ends of the discharge electrodes so as to generate plasma between the discharge electrodes disposed in the buffer chamber, and reactive gas supplied through the gas nozzle is excited by the plasma and is supplied to a target film located in a process chamber through a gas supply hole formed in the wall of the buffer chamber (refer to Patent Document 1).
[Patent Document 1] Japanese Patent No. 3,947,126

Although the discharge electrodes are vertically extended so as to generate plasma uniformly at the inside of the buffer chamber, the discharge electrodes can expand or shrink due to the influence of heat of a heater. In this case, plasma is non-uniformly generated, and thus the film thickness of a process-target substrate becomes non-uniform. However, there no effective means for checking shape variations of the discharge electrodes in the conventional art, and in many cases, shape variations of the discharge electrodes are detected only after the film thickness of the process-target substrate has become non-uniform.

SUMMARY OF THE INVENTION

An object of the present invention is to provide a substrate processing apparatus and a method of manufacturing a semiconductor device, in which shape variations of discharge electrodes can be early detected so as to prevent a film having anon-uniform thickness from being formed on a substrate.

According to an aspect of the present invention, there is provided a substrate processing apparatus including: a process chamber configured to stack a plurality of substrates therein; a gas supply unit configured to supply a gas into the process chamber; at least one pair of electrodes installed in the process chamber and configured to receive high-frequency power to generate plasma that excites the gas supplied into the process chamber; and a monitoring system configured to monitor a variation of a resonance frequency of the at least one pair of electrodes and a shape variation of the at least one pair of electrodes.

According to another aspect of the present invention, there is provided a substrate processing apparatus comprising: a process chamber configured to stack a plurality of substrates therein; a gas supply unit configured to supply gas to an inside of the process chamber; at least one pair of electrodes installed in the process chamber and configured to receive high-frequency power to generate plasma that excites the gas supplied to the inside of the process chamber; an absorption frequency meter configured to measure an absorption frequency at the electrodes; a comparison unit configured to compare a first frequency measured by the absorption frequency meter with a preset threshold value; an output unit configured to generate an alarm signal; and a control unit, wherein if the first frequency is greater than the threshold value, the control unit controls the comparison unit and the output unit so as to generate an alarm signal.

According to another aspect of the present invention, there is provided a method of manufacturing a semiconductor device by forming a film on a plurality of substrates stacked in a process chamber, the method comprising: loading substrates in the process chamber; forming the film on the substrates by applying high-frequency power to a pair of electrodes installed in the process chamber to excite process gas introduced into the process chamber; unloading the substrates from the process chamber; and monitoring a shape variation of the electrodes by using a monitoring system.

DETAILED DESCRIPTION OF THE PREFERRED EMBODIMENTS

According to preferred embodiments of the present invention, a substrate processing apparatus is configured as an example of a semiconductor manufacturing apparatus used to perform a processing process in a method of manufacturing a semiconductor device such as an integrated circuit (IC) device.

Figure 1:
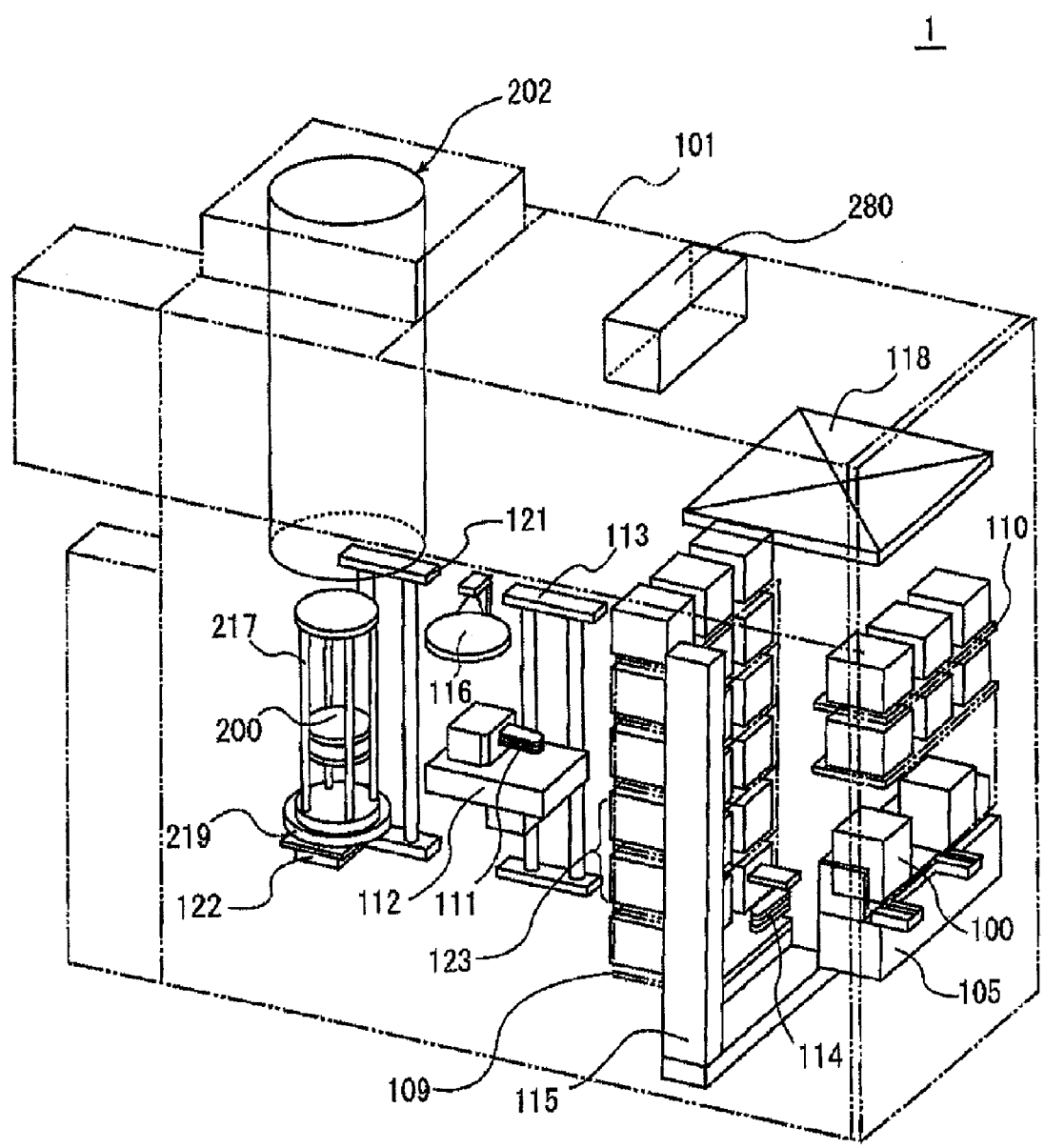
FIG. 1 is a perspective view illustrating a substrate processing apparatus relevant to an embodiment of the present invention.

Furthermore, in the following description, as a substrate processing apparatus, a vertical apparatus configured to perform a process such as oxidation, diffusion or chemical vapor deposition (CVD) on a substrate will be explained (hereinafter, the vertical apparatus will also be simply referred to as a processing apparatus). FIG. 1 is a perspective view illustrating a processing apparatus according to the present invention.

As shown in FIG. 1, in a processing apparatus 1 of the current embodiment, cassettes 100 are used as wafer carriers for accommodating wafers (substrates) 200 made of a material such as silicon, and the processing apparatus 1 includes a case 101. At the inside of a cassette carrying port (not shown)) of the case 101, a cassette stage (substrate container stage) 105 is installed. Cassettes 100 are carried onto the cassette stage 105 and away from the cassette stage 105 by an in-process carrying device (not shown).

On the cassette stage 105, the cassette 100 is placed by the in-process carrying device in a manner such that wafers 200 are vertically positioned inside the cassette 100 and a wafer carrying port of the cassette 100 faces upward. The cassette stage 105 is configured so that the cassette 100 can be rotated 90° counterclockwise in a longitudinal direction to the backward of the case 101, and the wafers 200 inside the cassette 100 can take a horizontal position, and the wafer carrying port of the cassette 100 can face the backward of the case 101.

Near the center part of the case 101 in a front-to-back direction, a cassette shelf (substrate container shelf) 109 is installed. The cassette shelf 109 is configured so that a plurality of the cassettes 100 can be stored in a plurality of stages and a plurality of rows. At the cassette shelf 109, a transfer shelf 123 is installed to store the cassettes 100.

In addition, at the upside of the cassette stage 105, a standby cassette shelf 110 is installed to store standby cassettes 100.

Between the cassette stage 105 and the cassette shelf 109, a cassette elevator (substrate container elevating mechanism) 115, which is capable of moving upward and downward while holding the cassette 100, and a cassette transfer device 114 are provided. By continuous motions of the cassette elevator 115 and the cassette transfer device 114, a cassette 100 can be carried among the cassette stage 105, the cassette shelf 109, and the standby cassette shelf 110.

At the backside of the cassette shelf 109, a wafer transfer device 112 capable of linearly moving a wafer 200 without rotating the wafer 200 horizontally, and a transfer elevator 113 configured to move the wafer transfer device 112 upward and downward are provided. The transfer elevator 113 is installed at a right end part of the case 101 (pressure-resistant case).

By continuous motions of the wafer transfer device 112 and the transfer elevator 113, a wafer 200 can be picked by tweezers (substrate holder) 111 of the wafer transfer device 112 and be charged into a boat (substrate holding unit) 217 and discharged from the boat 217.

At the upside of the rear part of the case 101, a process furnace 202 is installed. The lower end part of the process furnace 202 is configured so as to be opened and closed by a furnace port shutter (furnace port opening/closing mechanism) 116.

At the downside of the process furnace 202, a boat elevator (substrate holding unit elevating mechanism) 121 is installed to move the boat 217 upward to and downward from the process furnace 202. An elevating member 122 is connected to an elevating table of the boat elevator 121 as a connecting unit, and a seal cap 219 is horizontally installed on the elevating member 122 as a cover part. The seal cap 219 supports the boat 217 vertically and is configured to block the lower end part of the process furnace 202.

The boat 217 is configured to hold a plurality of wafers 200 (for example, about fifty to one hundred fifty wafers) horizontally in a state where the centers of the wafers 200 are aligned and arranged in a vertical direction.

As shown in FIG. 1, at the upside of the cassette shelf 109, a cleaning unit 118 configured by a supply fan and a dust filter is installed to supply clean air as purified atmosphere, so that clean air can flow inside of the case 101.

Next, the process furnace 202 will now be described in more detail with reference to FIG. 2.

Figure 2:
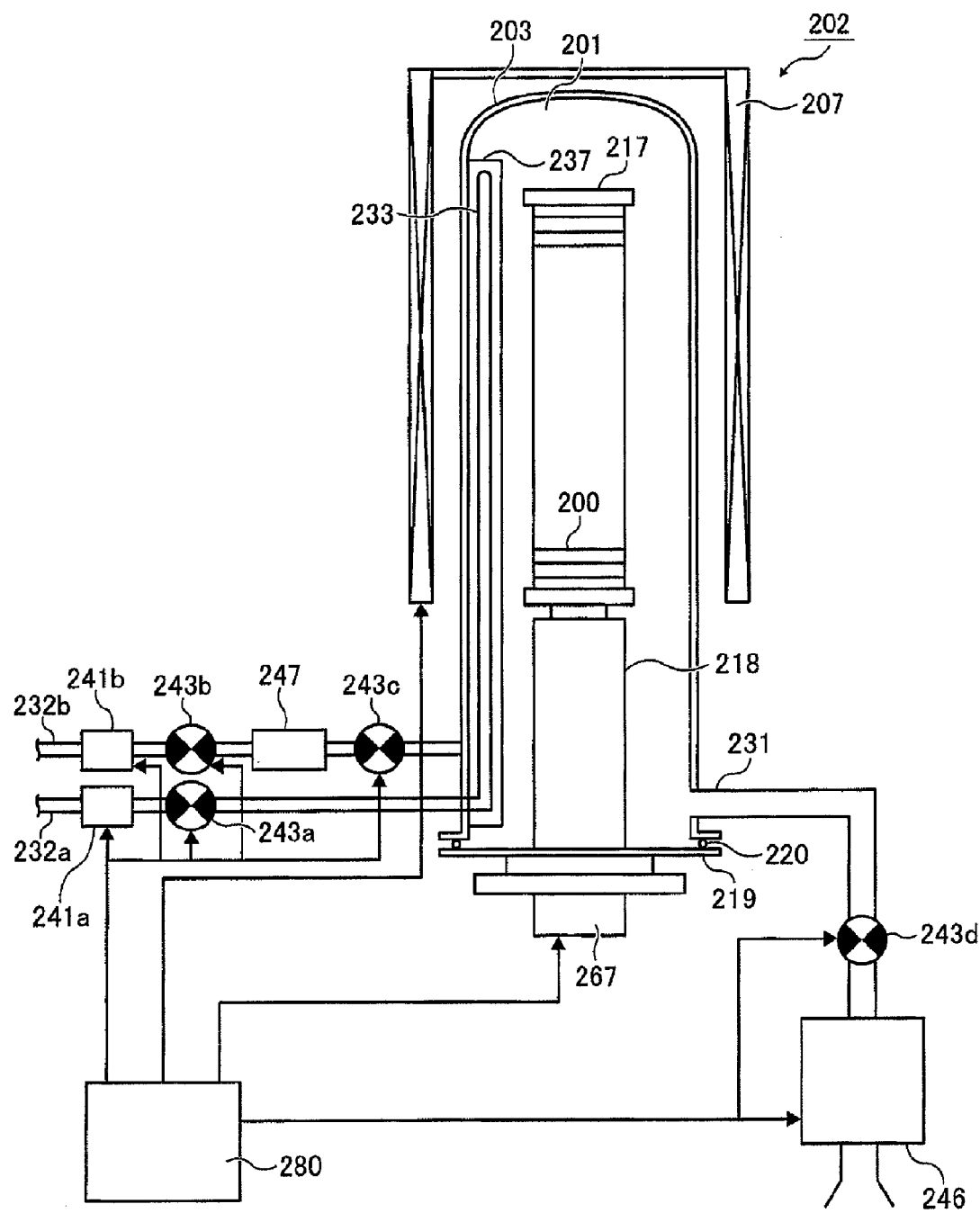
FIG. 2 is a vertical sectional view schematically illustrating a process furnace of the substrate processing apparatus relevant to the embodiment of the present invention.
Figure 3:
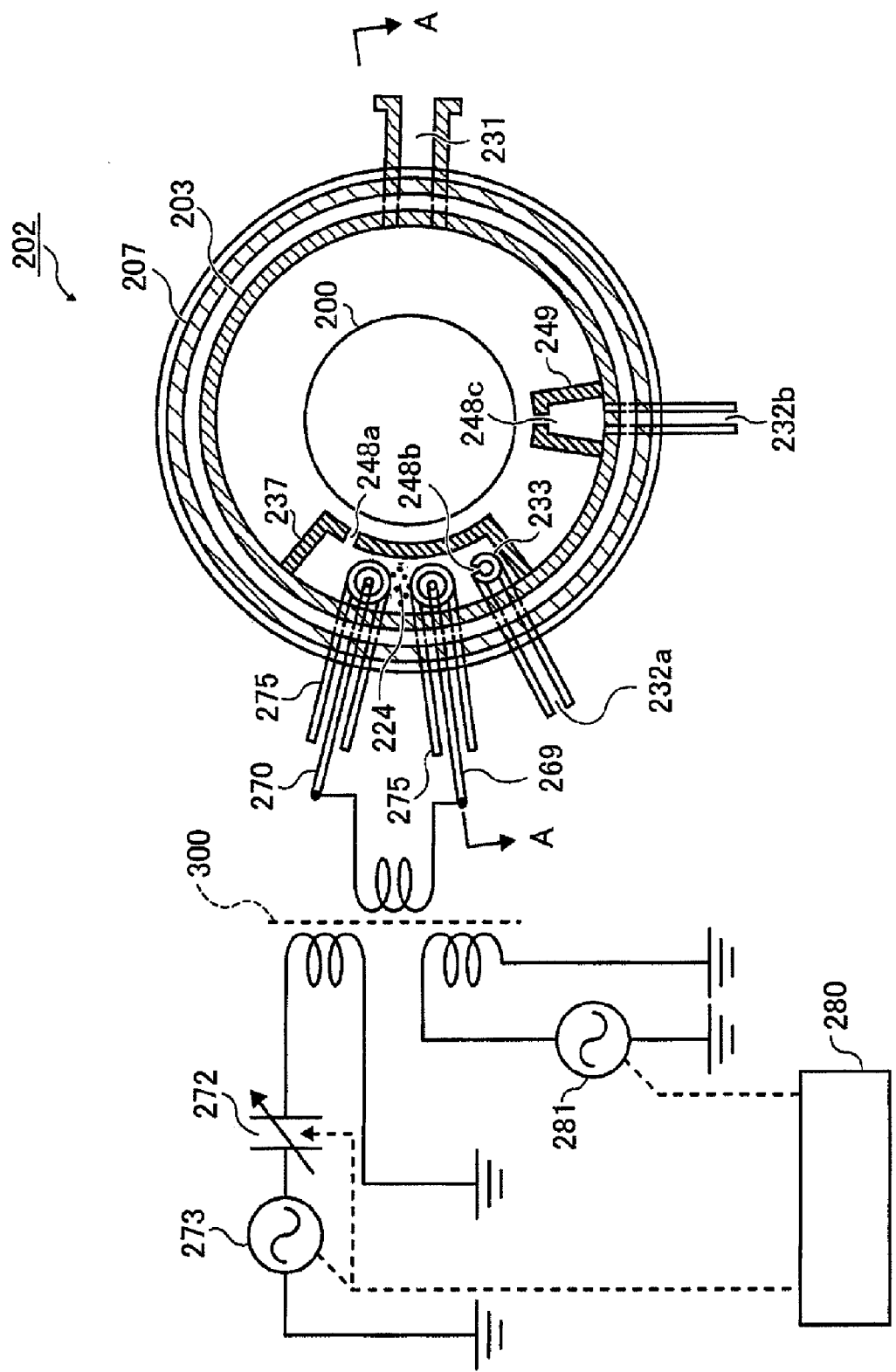
FIG. 3 is a horizontal sectional view schematically illustrating the process furnace of the substrate processing apparatus relevant to the embodiment of the present invention.

FIG. 2 is a schematic view illustrating a vertical substrate processing furnace that can be properly used according to an embodiment of the present invention. That is, FIG. 2 is a vertical sectional view illustrating the process furnace 202. FIG. 3 is a horizontal sectional view illustrating the process furnace 202.

The processing apparatus 1 of the current embodiment includes a controller 280 as a control unit, and operations of parts of the processing apparatus 1 and the process furnace 202 are controlled by the controller 280.

Inside a heater 207 which is a heating device (heating unit), a reaction tube 203 is installed as a reaction vessel to process wafers (substrates) 200, and a lower end opening of the reaction tube 203 is air-tightly closed by the seal cap (cover part) 219 in a state where an O-ring (airtight sealing member) 220 is disposed between the reaction tube 203 and the seal cap 219. A process chamber 201 is formed by at least the reaction tube 203 and the seal cap 219. At the seal cap 219, a boat 217 that is a substrate holding unit is installed in a state where a boat support stand 218 is disposed between the boat 217 and the seal cap 219. The boat support stand 218 is a holding body which is used to hold the boat 217. The boat 217 is inserted in the process chamber 201. At the boat 217, a plurality of wafers 200 to be batch processed are horizontally held and piled in multiple stages in an axial direction. The heater 207 heats the wafers 200 placed inside the process chamber 201 to a predetermined temperature.

At the process chamber 201, two gas supply pipes 232a and 232b are installed as supply units for supplying a plurality of gases (in the current embodiment, two kinds of gases). In the current embodiment, a process gas flows along the first gas supply pipe 232a through a first mass flow controller 241a which is a flowrate control device (flowrate control unit) and a first valve 243a which is an on-off valve, and then the process gas is supplied to the inside of the process chamber 201 through a buffer chamber 237 (described later) formed in the reaction tube 203. Another process gas flows along the second gas supply pipe 232b through a second mass flow controller 241b which is a flowrate control device (flowrate control unit), a second valve 243b which is an on-off valve, a gas reservoir 247, and a third valve 243c which is an on-off valve, and then the process gas is supplied to the inside of the process chamber 201.

The process chamber 201 is connected to a vacuum pump 246 which is an exhaust device (exhaust unit) via a gas exhaust pipe 231 and a fourth valve 243d, so that the process chamber 201 can be evacuated. The fourth valve 243d is an on-off valve which is configured to be opened and closed so as to start and stop evacuation of the process chamber 201, and configured to be adjusted in opening size for pressure controlling.

In an arc-shaped space between the inner wall of the reaction tube 203 forming the process chamber 201 and wafers 200, the buffer chamber 237 is installed as a gas diffusion space in a manner such that the buffer chamber 237 extends from a lower part to an upper part of the inner wall of the reaction tube 203 along the piled direction of the wafers 200, and first gas supply holes 248a are formed in an end part of a wall of the buffer chamber 237 adjacent to the wafers 200. The first gas supply holes 248a are opened toward the center of the reaction tube 203. The first gas supply holes 248a have the same open area and are formed at the same pitch from the lower side to the upper side.

At an end part of the buffer chamber 237 opposite to the first gas supply holes 248a, a nozzle 233 extends from the lower part to the upper part of the reaction tube 203 along the piled direction of the wafers 200. A plurality of second gas supply holes 248b are formed in the nozzle 233. If the pressure difference between the buffer chamber 237 and the process chamber 201 is small, it is preferable that the second gas supply holes 248b have the same open area and be formed at the same pitch from the upstream side to the downstream side. However, if the pressure difference is large, it is preferable that the open areas of the second gas supply holes 248b increase from the upstream side to the downstream side or the pitch of the second gas supply holes 248b decrease from the upstream side to the downstream side.

In the current embodiment, the open areas of the second gas supply holes 248b increase gradually from the upstream side to the downstream side. Owing to this configuration, gas can be ejected into the buffer chamber 237 through the second gas supply holes 248b with approximately the same flowrate along the second gas supply holes 248b although the velocity of the gas may be varied along the second gas supply holes 248b.

Thereafter, the velocity variation of the gas is reduced in the buffer chamber 237 as compared with the velocity variation at the second gas supply holes 248b, and then the gas is ejected into the process chamber 201 through the first gas supply holes 248a. Therefore, when gas supplied through the second gas supply holes 248b is ejected through the first gas supply holes 248a, the gas can have a uniform flowrate and velocity.

In addition, at the buffer chamber 237, first and second rod-shaped electrodes 269 and 270 which are first and second electrodes having a slender and long shape are installed in a state where the first and second rod-shaped electrodes 269 and 270 extend from the lower side to the upper side and are protected with electrode protection tubes 275. At the lower side of the reaction tube 203, the first and second rod-shaped electrodes 269 and 270 are connected to a secondary side of a high-frequency transformer 300.

A primary side of the high-frequency transformer 300 is connected to a high-frequency power source 273 through a matching device 272, and both ends thereof are grounded to a reference potential. Therefore, by applying high-frequency power from the high-frequency power source 273, plasma can be generated at a plasma generation region 224 between the first and second rod-shaped electrodes 269 and 270 so as to excite process gas.

An absorption frequency meter 281 is connected to the primary side of the high-frequency transformer 300, and both ends thereof are grounded to the reference potential. Therefore, an absorption frequency between the first and second rod-shaped electrodes 269 and 270 can be measured.

Figure 4:
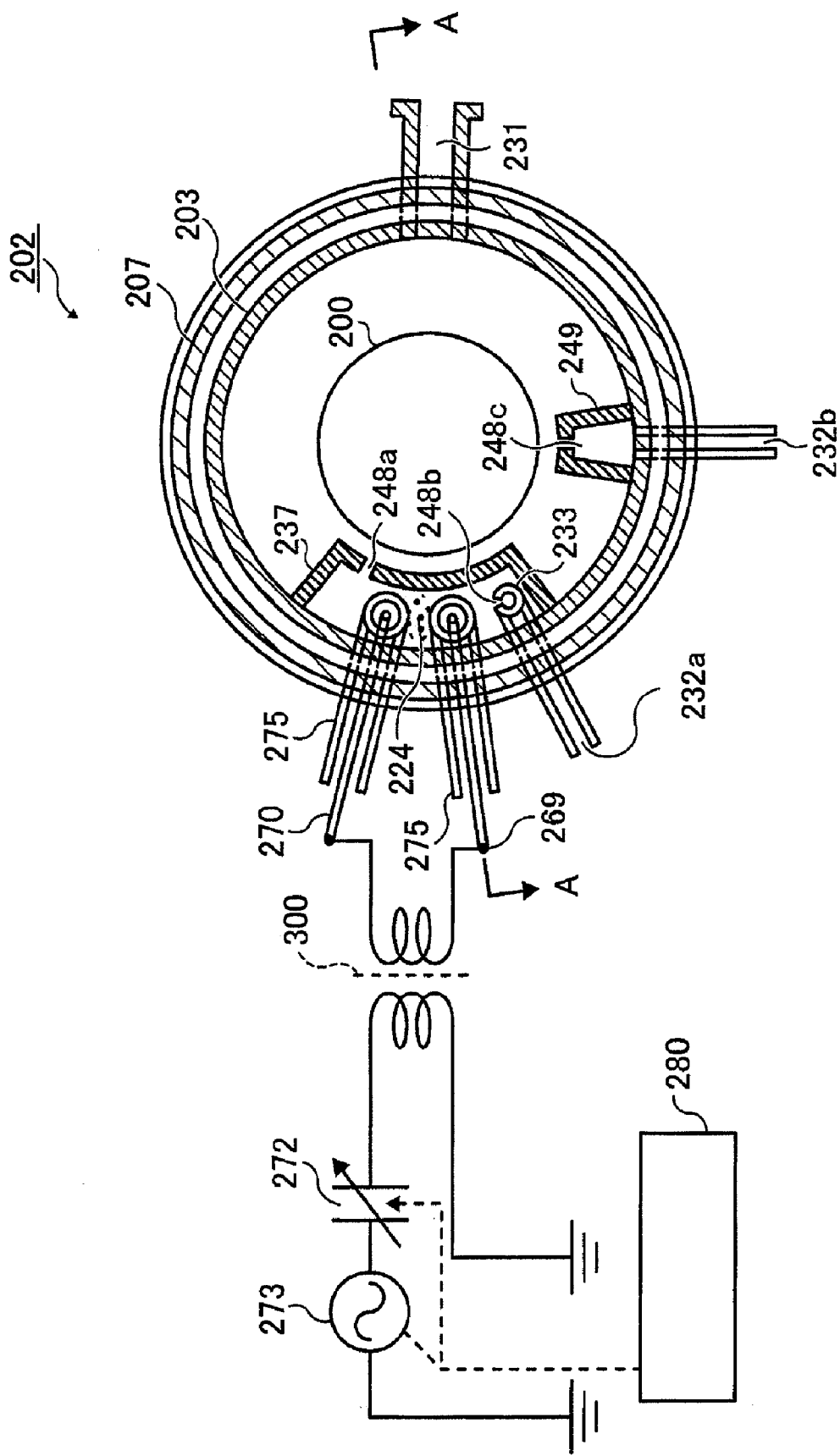
FIG. 4 is a horizontal sectional view schematically illustrating a conventional process furnace as a comparative example of the process furnace of the substrate processing apparatus relevant to the embodiment of the present invention.

FIG. 4 is a horizontal sectional view schematically illustrating a conventional process furnace 202 as a comparative example of the process furnace 202. When compared with the process furnace 202 of the current embodiment, an absorption frequency meter is not connected to a primary side of a high-frequency transformer 300.

The electrode protection tubes 275 are configured so that the first and second rod-shaped electrodes 269 and 270 can be respectively inserted into the buffer chamber 237 in a state where the first and second rod-shaped electrodes 269 and 270 are isolated from the atmosphere of the buffer chamber 237. If the atmosphere inside the electrode protection tubes 275 is the same as outside air (atmosphere), the first and second rod-shaped electrodes 269 and 270 inserted respectively in the electrode protection tubes 275 are oxidized by heat of the heater 207. For this reason, an inert gas purge mechanism is installed to fill or purge the inside areas of the electrode protection tubes 275 with inert gas such as nitrogen no as to maintain the oxygen concentration inside the electrode protection tubes 275 at a sufficiently low level for preventing oxidation of the first and second rod-shaped electrodes 269 and 270.

In addition, a gas supply unit 249 is installed on the inner wall of the reaction tube 203 at a position making about 120° with the first gas supply holes 248a. When a plurality of gases are supplied to the wafers 200 one after another in a film forming process by an atomic layer deposition (ALD) method, the gas supply unit 249 shares the task of supplying the plurality of gases with the buffer chamber 237.

Like the buffer chamber 237, the gas supply unit 249 includes a plurality of third gas supply holes 248c formed at positions close to the wafers 200 with the same pitch for supplying gas, and the lower part of the gas supply unit 249 is connected to the second gas supply pipe 232b.

If the pressure different between the insides of the gas supply unit 249 and the process chamber 201 is small, it is preferable that the third gas supply holes 248c have the same open area and be formed at the same pitch from the upstream side to the downstream side. However, if the pressure difference is large, it is preferable that the open areas of the third gas supply holes 248c increase or the pitch of the first gas supply holes 248a decrease from the upstream side to the downstream side.

In the current embodiment, the open areas of the third gas supply holes 248c increase gradually from the upstream side to the downstream side.

At the center part of the inside of the reaction tube 203, the boat 217, which includes a boat pillar part in which a plurality of wafers 200 are placed in multiple stages at the same intervals, is installed, and the boat 217 can be loaded into and unloaded from the reaction tube 203 by a boat elevating mechanism (not shown). In addition, a boat rotating mechanism 267 which is a rotary device (rotary unit) is installed to rotate the boat 217 and thus to improve processing uniformity, so that the boat 217 held on the boat support stand 218 can be rotated by rotating the boat rotating mechanism 267.

The controller 280, which is a control unit, is connected to the first and second mass flow controllers 241a and 241b, the first to fourth valves 243a, 243b, 243c, and 243d, the heater 207, the vacuum pump 246, the boat rotating mechanism 267, the boat elevating mechanism (not shown), the high-frequency power source 273, the matching device 272, and the absorption frequency meter 281, so as to control flowrate adjusting operations of the first and second mass flow controllers 241a and 241b; opening and closing operations of the first to third valves 243a, 243b, and 243c; opening, closing, and pressure adjusting operations of the fourth valve 243d; a temperature adjusting operation of the heater 207; start and stop operations of the vacuum pump 246; a rotation speed adjusting operation of the boat rotating mechanism 267; an elevating operation of the boat elevating mechanism; power supply controlling operations of the high-frequency power source 273 and the absorption frequency meter 281; and an impedance adjusting operation of the matching device 272.

Next, an operation of the processing apparatus 1 will be described.

As shown in FIG. 1, a cassette 100 is placed on the cassette stage 105 through the cassette carrying port in a state where wafers 200 are vertically positioned in the cassette 100 and the wafer carrying port of the cassette 100 faces upward. Next, the cassette 100 is rotated counterclockwise by 90° in a longitudinal direction toward the backward of the case 101 by the cassette stage 105, so that the wafers 200 inside the cassette 100 are horizontally positioned and the wafer carrying port of the cassette 100 faces the backward of the case 101.

Then, the cassette 100 is automatically carried and placed to a specified shelf position of the cassette shelf 109 or the standby cassette shelf 110 so as to be temporarily stored and then transferred to the transfer shelf 123 from the cassette shelf 109 or the standby cassette shelf 110, or the cassette is directly transferred to the transfer shelf 123.

After the cassette 100 is transferred to the transfer shelf 123, a wafer 200 is picked up from the cassette 100 through the wafer carrying port of the cassette 100 and is charged into the boat 217 by the tweezers 111 of the wafer transfer device 112. After delivering the wafer 200 to the boat 217, the wafer transfer device 112 returns to the cassette 100 so as to charge the next wafer 200 into the boat 217.

After a predetermined number of wafers 200 are charged into the boat 217, the lower end part of the process furnace 202 closed by the furnace port shutter 116 is opened by moving the furnace port shutter 116. Subsequently, the boat 217 holding the wafers 200 is loaded into the process furnace 202 by lifting the seal cap 219 using the boat elevator 121.

After the loading, a predetermined treatment is performed on the wafers 200 inside the process furnace 202.

Thereafter, the wafers 200 and the cassette 100 are carried to the outside of the case 101 in the reverse sequence of the above-described sequence.

Next, a process of forming a film on a substrate by an ALD method will now be described by taking a process of forming a SiN film using dichlorosilane (DCS) gas and ammonia ($NH_3$) gas as an example of a semiconductor device manufacturing process.

In the ALD method which is a kind of CVD method, process gases, which are two (or more) kinds of materials used in film formation, are sequentially supplied to a substrate one after another under predetermined film forming conditions (temperature, time, etc.), so as to make the process gases adsorbed on the substrate on an atomic layer basis and thus to form a film by surface reaction.

The use of a chemical reaction is such that, for example, when a silicon nitride (SiN) film is formed by the ALD method, high-quality film formation at a low temperature of 300° C. to 600° C. is possible by using DCS ($SiH_2Cl_2$, dichlorosilane) and $NH_3$. In addition, the gas supply is carried out in a way of supplying a plurality of reactive gases one after another. Therefore, the thickness of the film can be controlled by adjusting the number of reactive gas supply cycles (for example, if the film forming rate is 1 Å/cycle and it is intended to form a 20-Å film, the process is repeated 20 cycles).

First, wafers 200 on which films will be formed are charged into the boat 217 by placing the wafers 200 in the boat pillar part of the boat 217, and the boat 217 is loaded into the process chamber 201. Thereafter, the following three steps are sequentially performed.

(Step 1)

In step 1, $NH_3$ gas requiring plasma excitation, and DCS gas not requiring plasma excitation are allowed to flow in sequence. First, the first valve 243a installed at the first gas supply pipe 232a, and the fourth valve 243d installed at the gas exhaust pipe 231 are opened together to control the flowrate of $NH_3$ gas by using the first mass flow controller 241a of the first gas supply pipe 232a and eject the $NH_3$ gas into the buffer chamber 237 through the second gas supply holes 248b of the nozzle 233, and high-frequency power is applied across the first and second rod-shaped electrodes 269 and 270 from the high-frequency power source 273 through the matching device 272 so as to excite the $NH_3$ gas by plasma and supply the $NH_3$ gas to the inside of the process chamber 201 as an activated species while exhausting the $NH_3$ gas through the gas exhaust pipe 231. When $NH_3$ gas is supplied as an activated species by plasma-exciting the $NH_3$ gas, the fourth valve 234d is properly adjusted to keep the inside pressure of the process chamber 201 in the range from 10 Pa to 100 Pa, for example, 50 Pa. The supply flowrate of the $NH_3$ gas is controlled by the first mass flow controller 241a in the range from 1 slm to 10 slm, for example, 5 slm. The wafers 200 are exposed to the activated species obtained by plasma-exciting the $NH_3$ gas for 2 seconds to 120 seconds. At this time, the temperature of the heater 207 is set to 530° C. so as to keep the temperature of the wafers 200 in the range from 300° C. to 600° C. Since the reaction temperature of $NH_3$ is high, $NH_3$ does not react with the wafers 200 at the above-mentioned temperature range, and thus $NH_3$ is plasma-excited and supplied as an activate species. Therefore, the wafers 200 can be processed in a low set temperature range.

While the $NH_3$ gas is plasma-excited and supplied as an activated species, the second valve 243b disposed at the upstream side of the second gas supply pipe 232b is opened, and the third valve 243c disposed at the downstream side of the second gas supply pipe 232b is closed, so as to allow a flow of DCS gas. Then, the DCS gas is stored in the gas reservoir 247 installed between the second and third valves 243b and 243c. At this time, gas flowing in the process chamber 201 is the activated species produced by plasma-exciting $NH_3$ gas, and the DCS gas does not exist in the process chamber 201.

Therefore, the $NH_3$ gas does not cause a gas-phase reaction but is plasma-excited into an active species, which undergoes surface reaction (chemical adsorption) with surface parts such as under-layer films of the wafers 200.

(Step 2)

In step 2, the first valve 243a of the first gas supply pipe 232a is closed to cut off the supply of the $NH_3$ gas, but the DCS gas is allowed to flow continuously to the gas reservoir 247. When a predetermined amount of the DCS gas is filled in the gas reservoir 247 at a predetermined pressure, the upstream-side second valve 243b is closed so as to confine the DCS gas in the gas reservoir 247. In addition, the fourth valve 243d of the gas exhaust pipe 231 is kept in an opened state so as to exhaust the inside of the process chamber 201 to a pressure of 20 Pa or lower by using the vacuum pump 246, and thereby to remove the $NH_3$ gas remaining in the process chamber 201. At this time, inert gas such as $N_2$ can be supplied to the process chamber 201 to increase the efficiency of removing the remaining $NH_3$ gas from the process chamber 201. Inside the gas reservoir 247, the DCS gas is stored at a pressure of 20000 Pa or higher. In addition, it is configured so that the conductance between the gas reservoir 247 and the process chamber 201 is equal to or higher than $1.5 \times 10^{-3}$ $m^3/s$. When the volume of the reaction tube 203 and the corresponding volume of the gas reservoir 247 are considered, it is preferable that if the volume of the reaction tube 203 is 100 l, the volume of the gas reservoir 247 be 100 cc to 300 cc, and in terms of volume ratio, it is preferable that the volume of the gas reservoir 247 be 1/1000 to 3/1000 the volume of the reaction tube 203.

(Step 3)

In step 3, after the reaction tube 203 is completely exhausted, the fourth valve 243d of the gas exhaust pipe 231 is closed to stop the exhausting operation. Then, the third valve 243c disposed at the downstream side of the second gas supply pipe 232b is opened. Thus, the DCS contained in the gas reservoir 247 is supplied to the process chamber 201 all at once. At this time, since the fourth valve 243d of the gas exhaust pipe 231 is closed, the pressure inside the process chamber 201 increases steeply up to about 931 Pa (7 Torr). The time for supplying the DCS gas is set to 2 seconds to 4 seconds; exposure time to the increased-pressure atmosphere is set to 2 seconds to 4 seconds; and the total time is set to 6 seconds. At this time, the temperature of the wafers 200 is maintained at a desired temperature in the range from 300° C. to 600° C. like in the case of supplying the $NH_3$ gas. By the supply of the DCS gas, $NH_3$ adsorbed on the surfaces of the wafers 200 undergoes a surface reaction (chemical adsorption) with DCS, and thus SiN films are formed on the wafers 200. After the film formation, the third valve 243c is closed and the fourth valve 243d is opened so as to evacuate the process chamber 201 for removing the DCS gas remaining in the process chamber 201. In addition, at this time, inert gas such as $N_2$ can be supplied to the process chamber 201 for increasing the efficiency of removing the DCS gas which remains in the process chamber 201 after the film formation. In addition, the second valve 243b is opened to start supply of DCS gas to the gas reservoir 247.

The above-described steps 1 to 3 are set as one cycle, and the cycle is repeated a plurality of times to form SiN films on the wafers to a predetermined thickness.

Figure 5:
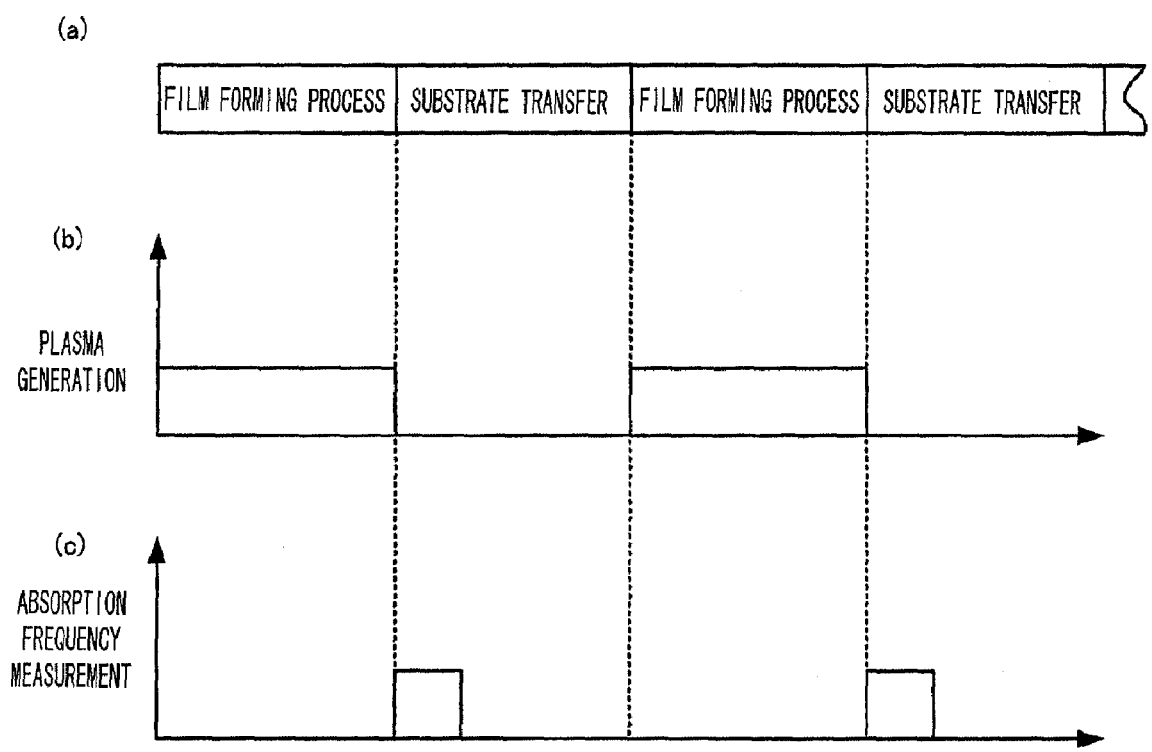
FIG. 5 is a view illustrating a process sequence relevant to an embodiment of the present invention.

FIG. 5 illustrates a process sequence of the substrate processing apparatus 1 relevant to an embodiment of the present invention. In FIG. 5, the section (a) illustrates processes in the process sequence, the section (b) illustrates a plasma generation sequence, and the section (c) illustrates an absorption frequency measuring sequence.

As shown in the section (a) of FIG. 5, the above-described film forming process including the steps 1 to 3, and the above-described substrate transferring process (in which processed wafers are collected and unprocessed wafers are loaded) are sequentially performed.

In the film forming process, high-frequency power is supplied from the high-frequency power source 273 to the first and second rod-shaped electrodes 269 and 270 so as to generate plasma at the inside of the buffer chamber 237 as shown in the section (b) of FIG. 5, and films are formed on target substrate 200 (substrate film forming process).

Next, while the processed substrates 200 are transferred after the film forming process, the absorption frequency meter 281 measures an absorption frequency as shown in the section (c) of FIG. 5 (substrate transferring process).

If an abnormal value is not detected from the measured absorption frequency, unprocessed substrates 200 are loaded (substrate transferring process), and the film forming process is repeated by generating plasma in the buffer chamber 237 as shown in the section (b) of FIG. 5 and forming films on the unprocessed substrates 200 (substrate film forming process).

That is, if an abnormal value is not detected from the measured absorption frequency, the substrate film forming process and the substrate transferring process are repeated. If an abnormal value is detected, an alarm signal is generated, and necessary action such as electrode replacement is taken instead of performing the next film forming process.

In addition, since electrode absorption frequency is measured during the substrate transferring process after the substrate film forming process, an additional time is unnecessary for the measurement, and thus the apparatus operation rate is not affected.

Figure 6:
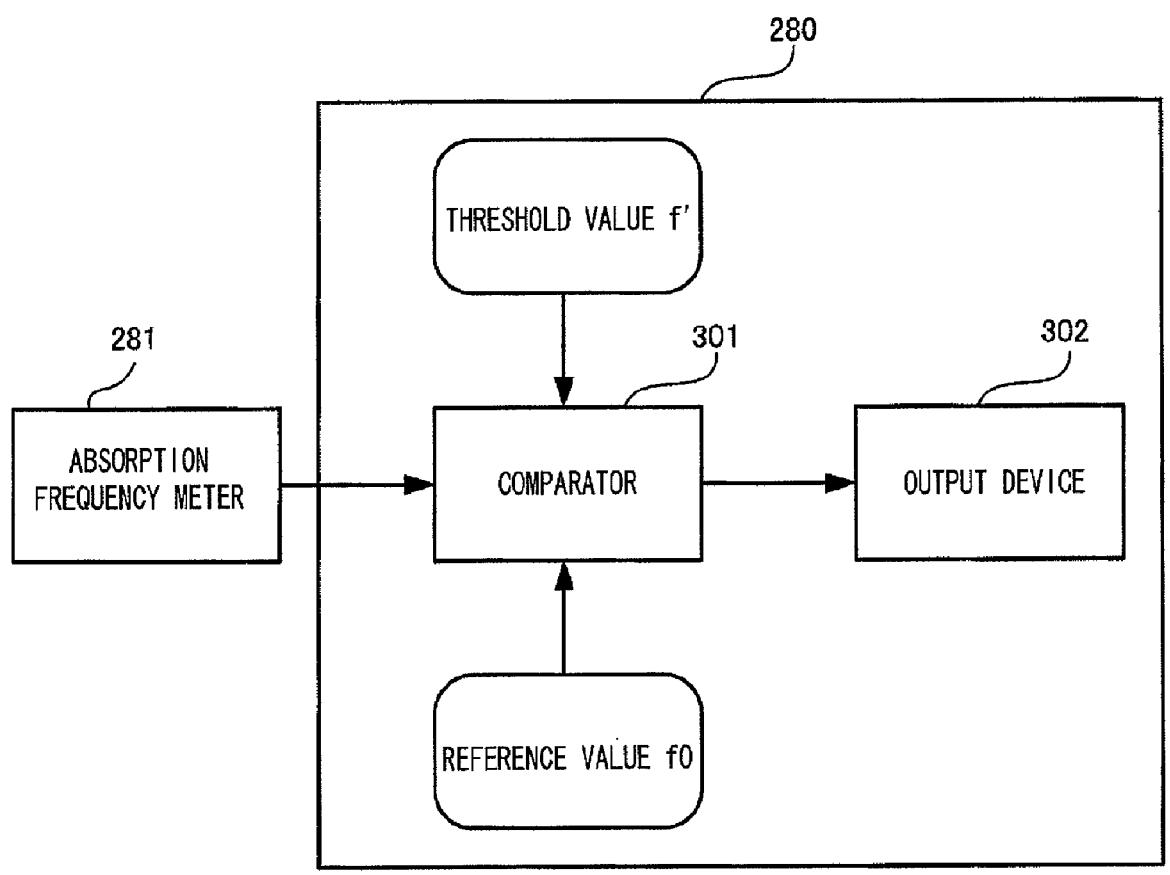
FIG. 6 is a view illustrating an operation of a controller relevant to an embodiment of the present invention.

Next, the function of the controller 280 in the absorption frequency measurement will now be described with reference to FIG. 6, As shown in FIG. 6, the controller 280 compares an electrode frequency fx measured by the absorption frequency meter 281 with a reference value f0 and a threshold value f' by using a comparator (comparison unit) 301, and if the electrode frequency fx differs from the threshold value f' by a predetermined value, the controller 280 controls the comparator 301 and an output device (output unit) 302 so as to generate an alarm signal through the output device 302 for reporting an abnormal value.

The output device 302 used to generate an alarm signal may be an audio unit capable of generating a sound, a display unit capable of displaying a signal on a screen, a combination thereof, or the like.

Figure 7:
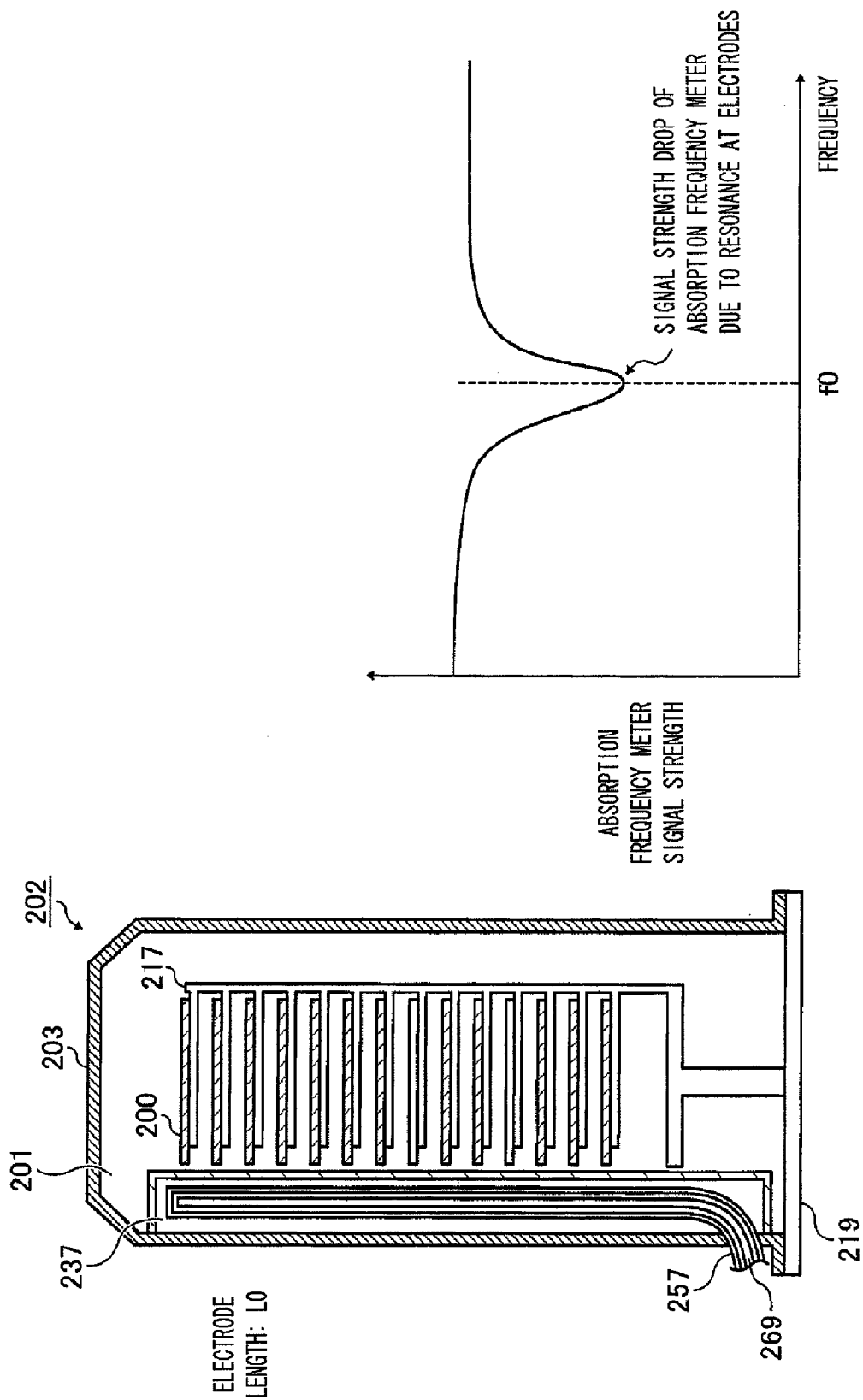
FIG. 7 is a view illustrating an exemplary waveform of an absorption frequency meter when the lengths of electrodes are normal according to an embodiment of the present invention.

FIG. 7 is a view illustrating an exemplary waveform of the absorption frequency meter 281 when the lengths of the first rod-shaped electrode 269 (first electrode) and the second rod-shaped electrode 270 (second electrode) are equal to a normal electrode length L0.

When the absorption frequency meter 281 absorbs high-frequency power of which the ¼ wavelength is equal to the normal electrode length L0, the output of the absorption frequency meter 281 has a local minimum at a certain frequency f0.

Figure 8:
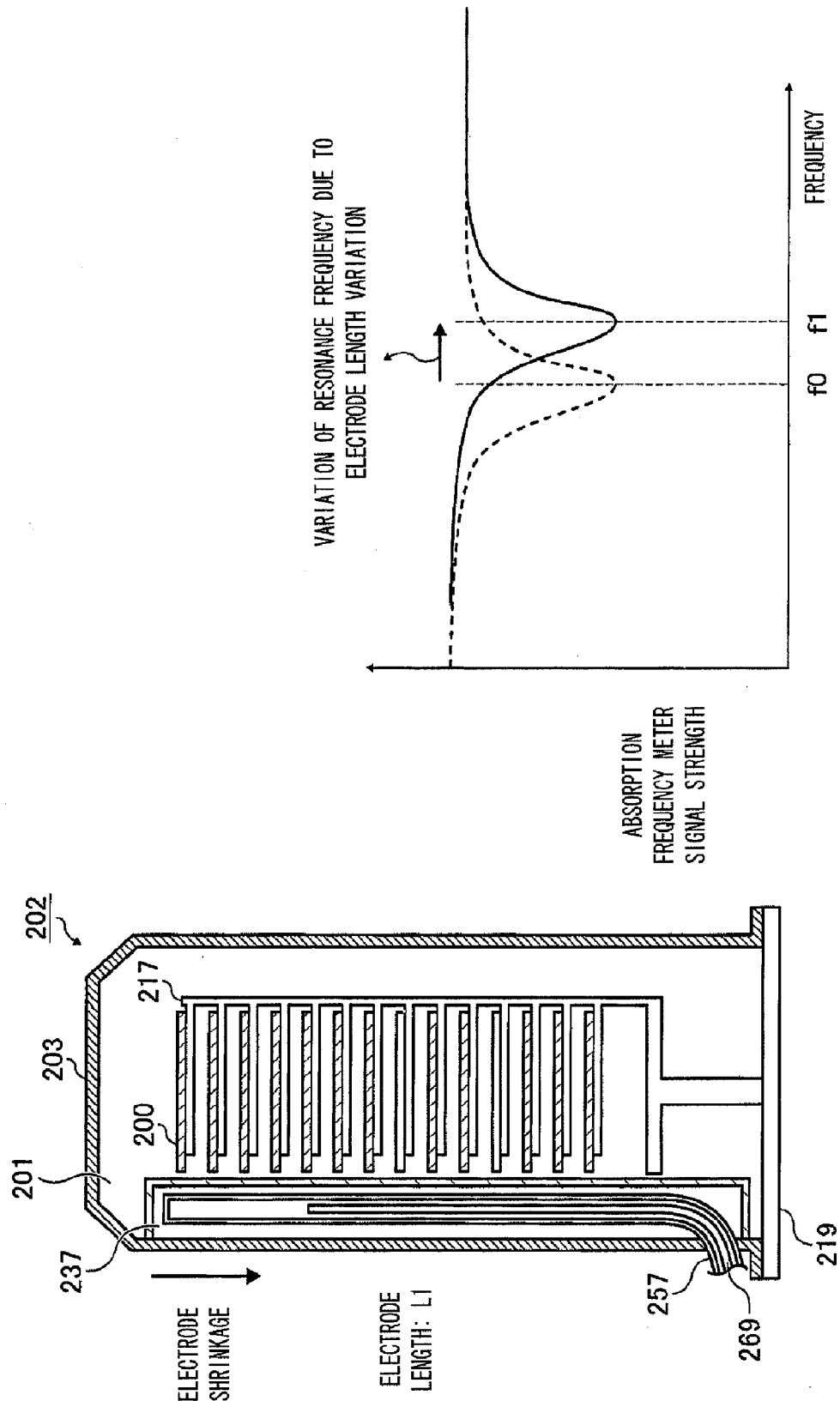
FIG. 8 is a view illustrating an exemplary waveform of an absorption frequency meter when the lengths of the electrodes are changed (reduced) according to an embodiment of the present invention.

FIG. 8 is a view illustrating an exemplary waveform of the absorption frequency meter 281 after the lengths of the first rod-shaped electrode 269 (first electrode) and the second rod-shaped electrode 270 (second electrode) are changed (reduced) to an electrode length L1.

Since the electrode length L1 is smaller than the normal electrode length L0, a local minimum occurs at a frequency f1 higher than the frequency f0 of the case of the normal electrode length L0.

Experimental example: the first and second rod-shaped electrodes 269 and 270 relevant to the embodiment of the present invention were connected to the secondary side of the high-frequency transformer 300 at the lower side of the reaction tube 203, and the absorption frequency meter 281 was connected to the primary side of the high-frequency transformer 300. Then, when the length of the first and second rod-shaped electrodes 269 and 270 was changed, frequency variations were measured.

Figure 9A:
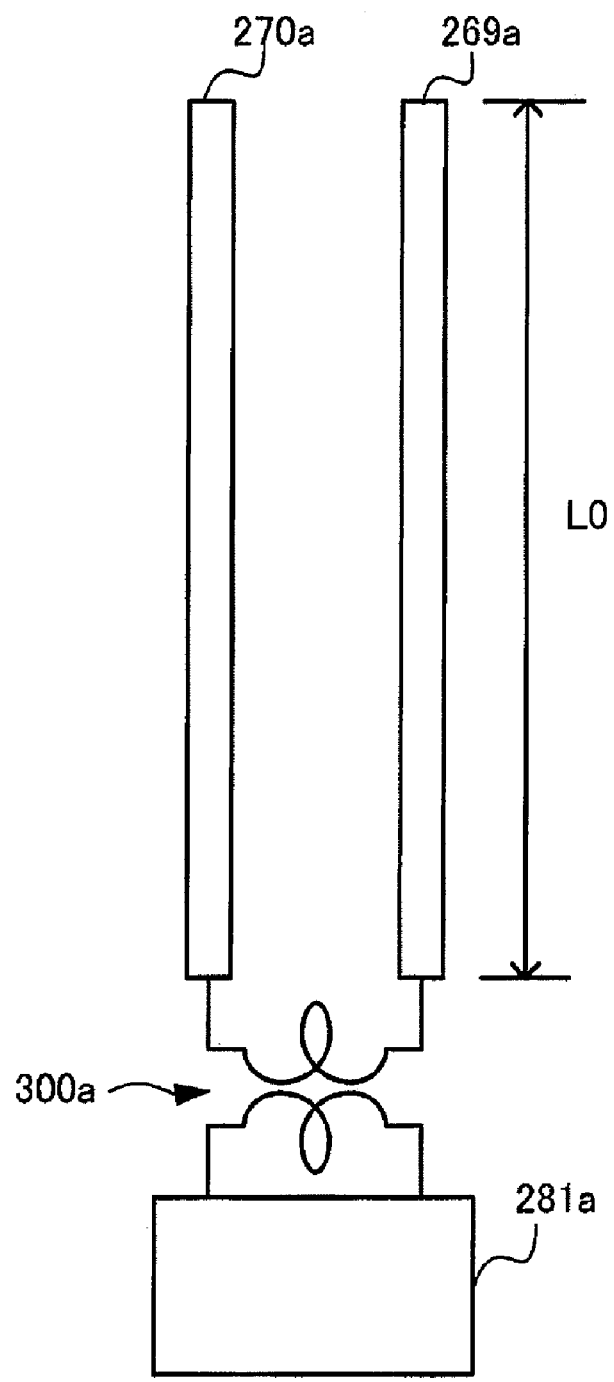
FIG. 9A and FIG. 9B are views for comparing absorption frequencies before the lengths of electrodes are changed (FIG. 9A) and after the lengths of the electrodes are changed (FIG. 9B) according to an embodiment of the present invention.
Figure 9B:
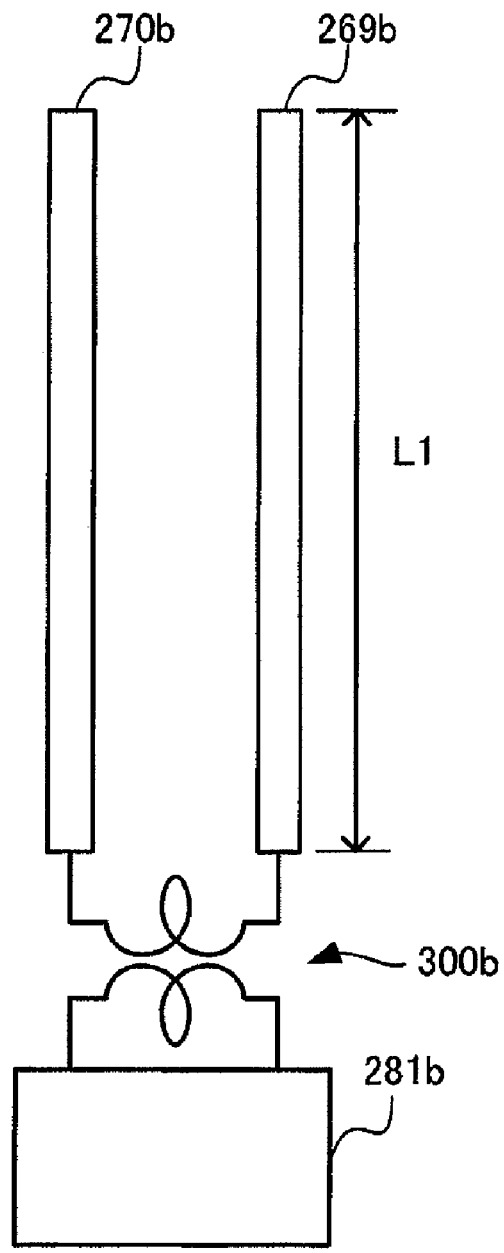

FIG. 9A is a schematic view illustrating the periphery of the first and second rod-shaped electrodes 269 and 270 before the length of the first and second rod-shaped electrodes 269 and 270 was changed, and FIG. 9B is a schematic view illustrating the periphery of the first and second rod-shaped electrodes 269 and 270 after the length of the first and second rod-shaped electrodes 269 and 270 was changed. For example, the first and second rod-shaped electrodes 269 and 270 were shortened after five film forming processes.

When the electrode length was equal to a normal length L0=1185 mm, an absorption frequency f0 was 44.3 MHz.

When the electrode length was reduced by 50 mm to a length L1=1135 mm, an absorption frequency f1 was 45.9 MHz.

That is, when the electrode length was reduced by 50 mm, the absorption frequency was increased by 1.6 MHz.

That is, when the length of an electrode reduces, the absorption frequency increases, and thus the shape variation of the electrode can be indirectly detected by monitoring the absorption frequency (resonance frequency) at which a local minimum exists. Therefore, the absorption frequency can be used as a reference for determining whether plasma is uniformly generated in the buffer chamber 237, and thus, it can be prevented that films having non-uniform thicknesses are formed on substrates.

In addition, the present invention can be applied to any processing method that uses a vertical apparatus, such as a plasma CVD method as well as an ALD method. Furthermore, although a process of forming a SiN film is explained as an example of film forming processes using an ALD method, the present invention is not limited thereto. The present invention can be applied to any processes regardless of kinds of films and gases as long as plasma is used.

Moreover, the present invention is not limited to a process chamber provided with a buffer chamber. That is, the present invention can be applied to a process chamber not provided with a buffer chamber.

According to the present invention, shape variations of discharge electrodes can be early detected, and thus it can be prevented that a film having a non-uniform thickness is formed on a substrate.

Although the present invention is characterized by the appended claims, the present invention also includes the following embodiments.

(Supplementary Note 1)

According to an embodiment of the present invention, there is provided a substrate processing apparatus comprising: a process chamber configured to stack a plurality of substrates therein; a gas supply unit configured to supply gas to an inside of the process chamber; at least one pair of electrodes installed in the process chamber and configured to receive high-frequency power to generate plasma that excites the gas supplied to the inside of the process chamber; and a monitoring system configured to monitor a shape variation of the electrodes.

(Supplementary Note 2)

In the substrate processing apparatus of Supplementary Note 1, the monitoring system may be configured to monitor a variation of a resonance frequency of the electrodes.

(Supplementary Note 3)

The substrate processing apparatus of Supplementary Note 1 may further comprise an absorption frequency meter.

(Supplementary Note 4)

In the substrate processing apparatus of Supplementary Note 1, the shape variation of the electrodes may be a length variation of the electrodes.

(Supplementary Note 5)

According to another preferred embodiment of the present invention, there is provided a substrate processing apparatus comprising: a process chamber configured to stack a plurality of substrates therein; a gas supply unit configured to supply gas to an inside of the process chamber; at least one pair of electrodes installed in the process chamber and configured to receive high-frequency power to generate plasma that excites the gas supplied to the inside of the process chamber; an absorption frequency meter configured to measure an absorption frequency at the electrodes; a comparison unit configured to compare a first frequency measured by the absorption frequency meter with a preset threshold value; an output unit configured to generate an alarm signal; and a control unit, wherein if the first frequency is greater than the threshold value, the control unit controls the comparison unit and the output unit no as to generate an alarm signal.

(Supplementary Note 6)

According to another preferred embodiment of the present invention, there is provided a method of manufacturing a semiconductor device by forming predetermined films on a plurality of substrates stacked in a process chamber, the method comprising: loading substrates in the process chamber; forming predetermined films on the substrates by applying high-frequency power to a pair of electrodes installed in the process chamber to excite process gas introduced into the process chamber; unloading the substrates from the process chamber; and monitoring a shape variation of the electrodes by using a monitoring system.

(Supplementary Note 7)

In the method of Supplementary Note 6, the monitoring system may be configured to monitor a variation of a resonance frequency of the electrodes.

(Supplementary Note 8)

In the method of Supplementary Note 6, the shape variation of the electrodes may be a length variation of the electrodes.

What is claimed is:

1. A substrate processing apparatus comprising:
   a process chamber configured to stack a plurality of substrates therein;
   a gas supply unit configured to supply a gas into the process chamber;
   at least one pair of electrodes installed in the process chamber and configured to receive high-frequency power to generate plasma that excites the gas supplied into the process chamber; and
   a monitoring system configured to monitor a variation of a resonance frequency of the at least one pair of electrodes and a shape variation of the at least one pair of electrodes.

2. The substrate processing apparatus of claim 1, further comprising:
   an absorption frequency meter.

3. A substrate processing apparatus comprising:
   a process chamber configured to stack a plurality of substrates therein;
   a gas supply unit configured to supply a gas into an inside of the process chamber;
   at least one pair of electrodes installed in the process chamber and configured to receive high-frequency power to generate plasma that excites the gas supplied into the inside of the process chamber; and
   a monitoring system configured to monitor a shape variation of the at least one pair of electrodes,
   wherein the shape variation of the at least one pair of electrodes is a length variation of the at least one pair of electrodes.

4. A substrate processing apparatus comprising:
   a process chamber configured to stack a plurality of substrates therein;
   a gas supply unit configured to supply a gas into the process chamber;
   at least one pair of electrodes installed in the process chamber and configured to receive high-frequency power to generate plasma that excites the gas supplied to the inside of the process chamber;
   an absorption frequency meter configured to measure an absorption frequency at the at least one pair of electrodes;
   a comparison unit configured to compare a first frequency measured by the absorption frequency meter with a preset threshold value;
   an output unit configured to generate an alarm signal; and a control unit, wherein if the first frequency is greater than the threshold value, the control unit controls the comparison unit and the output unit so as to generate an alarm signal.

5. A method of manufacturing a semiconductor device by forming a film on a plurality of substrates stacked in a process chamber, the method comprising:

loading the plurality of substrates in the process chamber;

forming the film on the plurality of substrates by applying high-frequency power to a pair of electrodes installed in the process chamber to excite a process gas introduced into the process chamber;

unloading the plurality of substrates from the process chamber; and monitoring a shape variation of the pair of electrodes by using a monitoring system.

6. The method of claim 5, wherein the monitoring system is configured to monitor a variation of a resonance frequency of the pair of electrodes.

7. The method of claim 5, wherein the shape variation of the pair of electrodes is a length variation of the pair of electrodes.

* * * * *